(12) United States Patent
Iwamoto (10) Patent No.: US 11,764,753 B2
(45) Date of Patent: Sep. 19, 2023

(54) ELASTIC WAVE DEVICE AND ELECTRONIC COMPONENT

(71) Applicant: Murata Manufacturing Co., Ltd., Nagaokakyo (JP)

(72) Inventor: Takashi Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1346 days.

(21) Appl. No.: 16/188,410

(22) Filed: Nov. 13, 2018

(65) Prior Publication Data

US 2019/0081610 A1 Mar. 14, 2019

Related U.S. Application Data

(63) Continuation of application No. PCT/JP2017/017147, filed on May 1, 2017.

(30) Foreign Application Priority Data

Jul. 1, 2016 (JP) .................................. 2016-131680

(51) Int. Cl.
*H03H 9/10* (2006.01)
*H03H 9/25* (2006.01)
(Continued)

(52) U.S. Cl.
CPC ...... *H03H 9/1078* (2013.01); *H03H 9/02834* (2013.01); *H03H 9/02897* (2013.01);
(Continued)

(58) Field of Classification Search
CPC ............. H03H 9/1078; H03H 9/02834; H03H 9/02897; H03H 9/0542; H03H 9/059; H03H 9/1085; H03H 9/145; H03H 9/25
See application file for complete search history.

(56) References Cited

U.S. PATENT DOCUMENTS

2001/0001293 A1* 5/2001 Gotoh .................... H03H 9/059
257/E23.126
2007/0200462 A1* 8/2007 Takano .............. H03H 9/02622
310/348
(Continued)

FOREIGN PATENT DOCUMENTS

JP 2003-258162 A 9/2003
JP 2006-245989 A 9/2006
(Continued)

OTHER PUBLICATIONS

Official Communication issued in International Patent Application No. PCT/JP2017/017147, dated Jul. 4, 2017.

*Primary Examiner* — J. San Martin
(74) *Attorney, Agent, or Firm* — KEATING & BENNETT, LLP (57) ABSTRACT

An elastic wave device includes a plate-shaped elastic wave element and a resin structure including a high elastic modulus resin portion and low elastic modulus resin portions. The low elastic modulus resin portions are provided in regions of side surfaces of an elastic wave element substrate, which extend from end portions at an IDT electrode formation surface side and do not reach a surface at a side opposite to an IDT electrode formation surface, and a remaining resin portion of a portion of the resin structure, which contacts with the side surfaces of the elastic wave element substrate, is the high elastic modulus resin portion.

20 Claims, 9 Drawing Sheets

(51) Int. Cl.
*H03H 9/02* (2006.01)
*H03H 9/05* (2006.01)
*H03H 9/145* (2006.01)

(52) U.S. Cl.
CPC .......... *H03H 9/059* (2013.01); *H03H 9/0542* (2013.01); *H03H 9/1085* (2013.01); *H03H 9/145* (2013.01); *H03H 9/25* (2013.01)

(56) References Cited

U.S. PATENT DOCUMENTS

2008/0272858 A1 11/2008 Furihata et al.
2020/0127635 A1* 4/2020 Matsumoto ........ H03H 9/02897

FOREIGN PATENT DOCUMENTS

| JP | 2006-311183 A | 11/2006 |
| JP | 2007-142149 A | 6/2007 |
| JP | 2015-015546 A | 1/2015 |

* cited by examiner

ELASTIC WAVE DEVICE AND ELECTRONIC COMPONENT

CROSS REFERENCE TO RELATED APPLICATIONS

This application claims the benefit of priority to Japanese Patent Application No. 2016-131680 filed on Jul. 1, 2016 and is a Continuation Application of PCT Application No. PCT/JP2017/017147 filed on May 1, 2017. The entire contents of each application are hereby incorporated herein by reference.

BACKGROUND OF THE INVENTION

1. Field of the Invention

The present invention relates to an elastic wave device in which an elastic wave element is surrounded by a resin structure and an electronic component including the elastic wave device.

2. Description of the Related Art

Conventionally, there has been known a configuration in which a portion of an elastic wave element except for an IDT electrode formation surface is sealed with resin. In an elastic wave device described in Japanese Unexamined Patent Application Publication No. 2006-245989, an elastic wave element is mounted on a mounting substrate. An IDT electrode formation surface of the elastic wave element opposes an upper surface of the mounting substrate with a gap therebetween. A sealing resin layer is provided so as to cover the surface of the elastic wave element at the side opposite to the IDT electrode formation surface and the side surfaces thereof. In Japanese Unexamined Patent Application Publication No. 2006-245989, the sealing resin layer has first to third sealing resin layers. The first sealing resin layer has the lowest elastic modulus and covers the surface of the elastic wave element at the side opposite to the IDT electrode formation surface and the side surfaces thereof. The second sealing resin layer has the highest elastic modulus and is laminated in an outer side portion of the first sealing resin layer. The third sealing resin layer has an elastic modulus which is higher than that of the first sealing resin layer and is lower than that of the second sealing resin layer. The third sealing resin layer is laminated in an outer side portion of the second sealing resin layer.

In the elastic wave device described in Japanese Unexamined Patent Application Publication No. 2006-245989, the elastic wave element is covered with the first sealing resin layer having the low elastic modulus. Therefore, when external force or a thermal shock is applied thereto, the elastic wave element moves, and thus, there is a risk that disconnection of a wiring, or the like occurs.

On the other hand, in order to suppress movement of the elastic wave element due to the external force, it is conceivable to form a sealing resin layer which makes direct contact with the elastic wave element using sealing resin having a high elastic modulus. However, in this case, when the external force is applied thereto, large stress is applied to the elastic wave element. Therefore, there arises a problem that a piezoelectric body of the elastic wave element is distorted and frequency characteristics of the elastic wave element are changed.

SUMMARY OF THE INVENTION

Preferred embodiments of the present invention provide elastic wave devices and electronic components in each of which an elastic wave element hardly moves and changes in frequency characteristics hardly occur even when an external force or a thermal shock is applied thereto.

An elastic wave device according to an aspect of a preferred embodiment of the present invention includes an elastic wave element including an elastic wave element substrate including an IDT electrode formation surface and an IDT electrode provided on the IDT electrode formation surface, and a resin structure including first and second main surfaces opposing each other and being embedded with the elastic wave element such that at least a portion of the IDT electrode formation surface is exposed at the first main surface side, in which the resin structure includes a high elastic modulus resin portion having a relatively high elastic modulus and a low elastic modulus resin portion having a relatively low elastic modulus, and the low elastic modulus resin portion is provided in a region of a side surface of the elastic wave element substrate, which extends from an end portion at the IDT electrode formation surface side and does not reach a surface at a side opposite to the IDT electrode formation surface, and a remaining resin portion of a portion of the resin structure, which contacts with the side surface of the elastic wave element substrate, is the high elastic modulus resin portion.

In one specific aspect of an elastic wave device according to a preferred embodiment of the present invention, the IDT electrode formation surface of the elastic wave element substrate and the first main surface of the resin structure are flush with each other. In this case, even when a wiring across the IDT electrode formation surface and the first main surface of the resin structure is provided, no bending portion is present in the wiring and no stress concentration therefore occurs, so that disconnection of the wiring is significantly reduced or prevented.

In another specific aspect of an elastic wave device according to a preferred embodiment of the present invention, the IDT electrode formation surface of the elastic wave element substrate is not flush with the first main surface of the resin structure.

In still another specific aspect of an elastic wave device according to a preferred embodiment of the present invention, the resin structure includes a through-electrode penetrating from the first main surface to the second main surface and a first electrode provided on the first main surface and connected to the through-electrode, and the first electrode is electrically connected to the elastic wave element.

In still another specific aspect of an elastic wave device according to a preferred embodiment of the present invention, the resin structure includes a plurality of second electrodes provided on the second main surface and connected to the through-electrode, the plurality of first electrodes is provided on the first main surface, and a density of the plurality of second electrodes is lower than a density of the plurality of first electrodes. In this case, it is possible to easily make electrical connection with the outside by using the plurality of second electrodes on the second main surface of the resin structure.

In still another specific aspect of an elastic wave device according to a preferred embodiment of the present invention, the low elastic modulus resin portion extends onto the IDT electrode formation surface of the elastic wave element substrate.

In still another specific aspect of an elastic wave device according to a preferred embodiment of the present invention, a wiring electrode connected to the first electrode and extending from the top of the first main surface of the resin structure to the IDT electrode formation surface of the elastic wave element is further provided.

In still another specific aspect of an elastic wave device according to a preferred embodiment of the present invention, the wiring electrode extends onto the low elastic modulus resin portion which extends onto the IDT electrode formation surface.

In general, thermal stress is concentrated on a boundary portion between a resin structure and an elastic wave element. If a wiring is directly present on that portion, the stress is also directly applied to the wiring. On the other hand, when the low elastic modulus resin portion is present therebetween, the thermal stress which is applied to the wiring is moderated. Therefore, disconnection of the wiring electrode is significantly reduced or prevented.

In still another specific aspect of an elastic wave device according to a preferred embodiment of the present invention, the elastic wave element substrate is a piezoelectric substrate.

In still another specific aspect of an elastic wave device according to a preferred embodiment of the present invention, the elastic wave element substrate includes a piezoelectric thin film and a high sound speed member provided on one surface of the piezoelectric thin film and having a higher sound speed of a bulk wave which is propagating than a sound speed of an elastic wave propagating in the piezoelectric thin film.

In still another specific aspect of an elastic wave device according to a preferred embodiment of the present invention, a low sound speed member provided between the high sound speed member and the piezoelectric thin film and having a lower sound speed of a bulk wave which is propagating than the sound speed of the elastic wave propagating in the piezoelectric thin film is further provided.

In still another specific aspect of an elastic wave device according to a preferred embodiment of the present invention, an electronic component laminated on the second main surface of the resin structure is further provided.

An electronic component according to a preferred embodiment of the present invention includes a mounting substrate including a mounting surface, and an elastic wave device according to one of preferred embodiments of the present invention, and is mounted on the mounting surface of the mounting substrate.

According to preferred embodiments of the present invention, it is possible to provide elastic wave devices and electronic components in each of which an elastic wave element hardly moves and changes in frequency characteristics hardly occur even when an external force or a thermal shock is applied thereto.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention is made clear by describing specific preferred embodiments of the present invention with reference to the accompanying drawings.

It should be noted that each of the preferred embodiments described in the specification is exemplary and partial replacement or combination of configurations is possible between different preferred embodiments.

Figure 1:
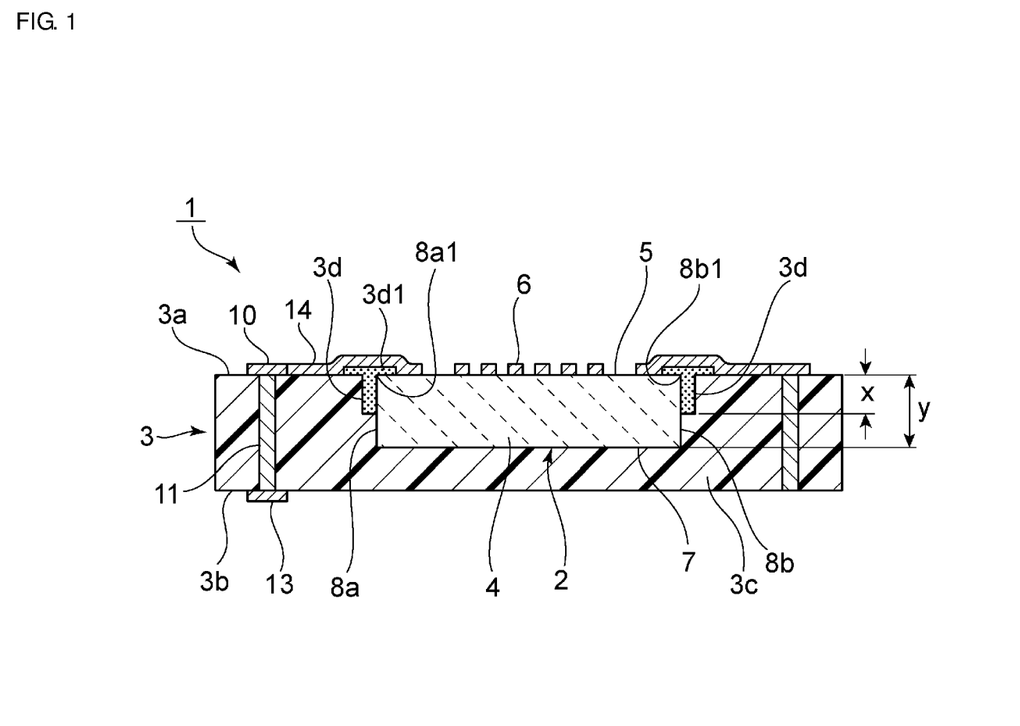
FIG. 1 is a front cross-sectional view of an elastic wave device according to a first preferred embodiment of the present invention.

FIG. 1 is a front cross-sectional view of an elastic wave device according to a first preferred embodiment of the present invention. An elastic wave device 1 includes a plate-shaped elastic wave element 2 and a resin structure 3. The elastic wave element 2 includes an elastic wave element substrate 4. In the present preferred embodiment, the elastic wave element substrate 4 is defined by a piezoelectric body. The piezoelectric body to be used is not particularly limited, and a piezoelectric single crystal such as $LiNbO_3$ and $LiTaO_3$ or piezoelectric ceramics can be used.

The elastic wave element substrate 4 includes an IDT electrode formation surface 5. An IDT electrode 6 is provided on the IDT electrode formation surface 5.

The elastic wave element substrate 4 includes a surface 7 opposing the IDT electrode formation surface 5, and side surfaces 8a and 8b connecting the IDT electrode formation surface 5 and the surface 7. Although not clearly illustrated in FIG. 1, the elastic wave element substrate 4 preferably has a rectangular or substantially rectangular planar shape, for example. Therefore, the elastic wave element substrate 4 includes another pair of side surfaces in addition to the side surfaces 8a and 8b opposing each other.

The resin structure 3 includes first and second main surfaces 3a and 3b opposing each other. In the present preferred embodiment, the resin structure 3 has a plate-shaped structure. However, the resin structure 3 may have a structure other than the plate-shaped structure. The elastic wave element 2 is embedded in the resin structure 3 such that at least a portion of the IDT electrode formation surface 5 is exposed. In the present preferred embodiment, the IDT electrode formation surface 5 is flush with the first main surface 3a.

The resin structure 3 includes a high elastic modulus resin portion 3c having a relatively high elastic modulus and low elastic modulus resin portions 3d having a relatively low elastic modulus. Note that the elastic modulus mainly means Young's modulus. The low elastic modulus resin portions 3d are provided so as to contact with portions of the side surfaces 8a and 8b of the elastic wave element substrate 4. More specifically, the low elastic modulus resin portions 3d are provided in regions of the side surfaces 8a and 8b, which extend downward from end portions 8a1 and 8b1 of the side surfaces 8a and 8b at the IDT electrode formation surface side and do not reach end edges defined by the side surfaces 8a and 8b and the surface 7.

In other words, the low elastic modulus resin portions 3d are provided in the regions of the side surfaces 8a and 8b of the elastic wave element substrate 4, which extend from the end portions 8a1 and 8b1 at the IDT electrode formation surface side and do not reach the surface 7 at the side opposite to the IDT electrode formation surface 5 and a remaining resin portion of a portion of the resin structure 3, which contacts with the side surfaces 8a and 8b of the elastic wave element substrate 4, is the high elastic modulus resin portion 3c. It is thus possible to provide the elastic wave device 1 in which the elastic wave element 2 hardly moves and changes in frequency characteristics hardly occur even when external force or a thermal shock is applied thereto.

A length of the low elastic modulus resin portions 3d from the end portions 8a1 and 8b1 of the side surfaces 8a and 8b at the IDT electrode formation surface side to the lower ends of the low elastic modulus resin portions 3d is defined as x. When a height direction dimension of the side surfaces 8a and 8b, i.e., a distance between the IDT electrode formation surface 5 and the surface 7 is y, it is sufficient that x<y is satisfied, and preferably, x is equal to or smaller than (about ½) of y, for example. This is because force of separating the elastic wave element substrate 4 from the resin structure 3 will be decreased abruptly when a side surface coverage ratio with the high elastic modulus resin portion 3c exceeds about ½, for example.

Although not illustrated in FIG. 1, the low elastic modulus resin portion is provided also on another pair of side surfaces (not illustrated) so as to contact with the side surfaces.

In the resin structure 3, the resin portion other than the portions in which the above-described low elastic modulus resin portions 3d are provided is the high elastic modulus resin portion 3c described above.

In this preferred embodiment, the low elastic modulus resin portions 3d are made of appropriate resin having a lower elastic modulus than that of the high elastic modulus resin portion 3c. As such resin, a material mainly containing one type of polyimide, polybenzoxazole, silicone resin, polyimideamide and polyurethane is preferably used.

The high elastic modulus resin portion 3c is made of an appropriate resin material having a higher elastic modulus than that of the low elastic modulus resin portions 3d. As such a resin material, a material mainly containing synthetic resin such as epoxy resin or a substance obtained by blending an inorganic material into resin can be used.

Note that, mainly containing means that a material contains something equal to or higher than about 50% in terms of a volume ratio, for example.

Preferably, the elastic modulus of the above-described high-modulus resin portion 3c is equal to or higher than about 5 GPa, for example. In this case, in the elastic wave device 1, it is possible to more reliably protect the elastic wave element 2.

Preferably, the elastic modulus of the low elastic modulus resin portions 3d is equal to or lower than about 3 GPa, for example. In this case, deterioration of the characteristics of the elastic wave element 2 due to stress applied from the outside is able to be reduced or prevented more effectively. Disconnection or the like, which will be described later, is significantly reduced or prevented.

Note that the above-described elastic modulus is a value specified by a mechanical test method.

First electrodes 10 are provided on the first main surface 3a of the resin structure 3. Via electrodes 11 as through-electrodes are provided in the resin structure 3 so as to be electrically connected to the first electrodes 10. The via electrodes 11 penetrate through the resin structure 3 from the first main surface 3a to the second main surface 3b. A second electrode 13 is provided on the second main surface 3b. The second electrode 13 is provided to electrically connect the elastic wave device 1 to the outside.

Wiring electrodes 14 are provided so as to be electrically connected to the first electrodes 10. The wiring electrodes 14 are electrically connected to the IDT electrode 6 in portions which are not illustrated in the drawings.

In the present preferred embodiment, the low elastic modulus resin portions 3d extend onto the first main surface 3a and the IDT electrode formation surface 5 through the end portions 8a1 and 8b1 of the side surfaces 8a and 8b at the IDT electrode formation surface side. Film portions 3d1 which extend onto the first main surface 3a and the IDT electrode formation surface 5 are provided bridging the first main surface 3a and the IDT electrode formation surface 5. The wiring electrodes 14 extend onto the IDT electrode formation surface 5, passing over the film portions 3d1.

In the elastic wave element 2, when an external force is applied to the elastic wave element substrate 4 defined by the piezoelectric body, characteristics of the elastic wave element 2 will vary due to a piezoelectric effect. In addition, in the elastic wave element 2, energy of surface acoustic waves excited by the IDT electrode 6 is concentrated in the vicinity of the IDT electrode formation surface 5. Accordingly, it is possible to effectively reduce or prevent the variation in the frequency characteristics due to the external force and the thermal shock with the low elastic modulus resin portions 3d provided in the regions of the side surfaces 8a and 8b of the elastic wave element substrate 4, which extend from the end portions 8a1 and 8b1 at the IDT electrode formation surface side and do not reach the surface 7 at the side opposite to the IDT electrode formation surface 5. Therefore, in the elastic wave device 1, even when the external force or the thermal shock is applied, changes in the frequency characteristics hardly occur.

In addition, the wiring electrodes 14 reaches the IDT electrode formation surface 5, passing over the film portions 3d1 of the low elastic modulus resin portions 3d. Therefore, even when the above-described external force is applied or distortion is caused by difference in coefficients of linear expansion between the resin structure 3 and the elastic wave element substrate 4 due to thermal stress, disconnection in the wiring electrodes 14 also hardly occurs.

Further, the high elastic modulus resin portion 3c is present in lower portions of the side surfaces 8a and 8b of the elastic wave element substrate 4 and around the surface 7. Therefore, it is possible to reliably protect the elastic wave element 2 from the external heat shock and the external force. In addition, since it has a structure in which the elastic wave element 2 is embedded in the above-described resin structure 3, it is possible to achieve size reduction.

A non-limiting example of a method of manufacturing the elastic wave device 1 will be described with reference to FIG. 2A to FIG. 2C, and to FIG. 5.

Figure 2A:
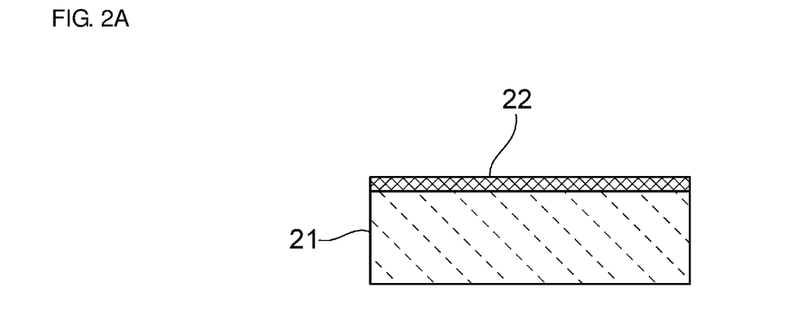
FIGS. 2A to 2C are front cross-sectional views for explaining a manufacturing process of the elastic wave device according to the first preferred embodiment of the present invention.
Figure 2B:
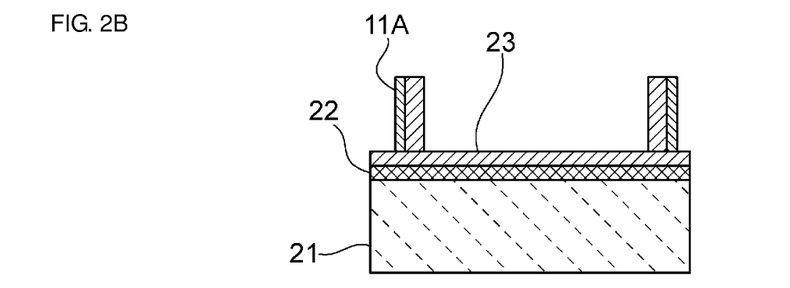
Figure 2C:
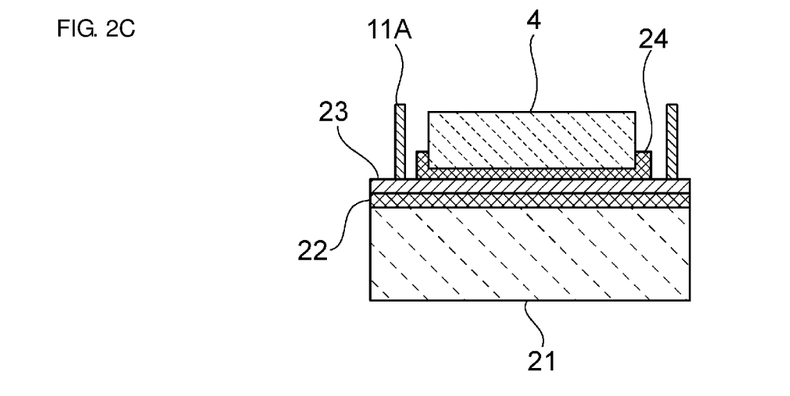
Figure 3A:
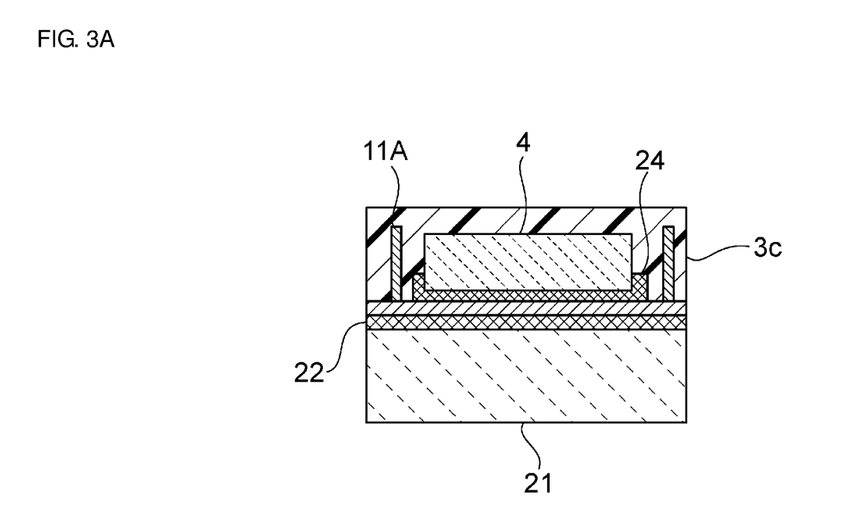
FIGS. 3A and 3B are front cross-sectional views for explaining the manufacturing process of the elastic wave device in the first preferred embodiment of the present invention.
Figure 3B:
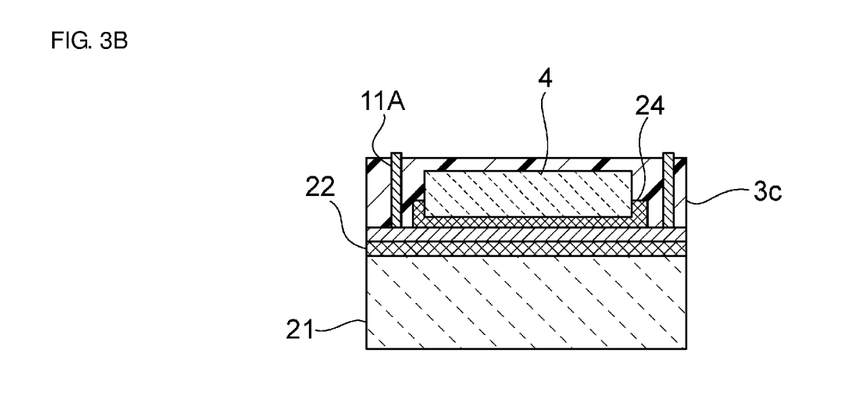

As illustrated in FIG. 2A, a resist layer 22 is formed on a support substrate 21. Then, as illustrated in FIG. 2B, a metal film 23 is formed on the resist layer 22. On the metal film 23, a metal layer 11A forming the via electrodes 11 is provided by photolithography or the like. Thereafter, as illustrated in FIG. 2C, a temporary fixing resin layer 24 is provided. As the temporary fixing resin layer 24, a resist material or the like can be used. The elastic wave element substrate 4 is press-fitted onto the temporary fixing resin layer 24. When the elastic wave element substrate 4 is press-fitted, the elastic wave element 2 is press-fitted such that the IDT electrode formation surface 5 is a lower surface. Subsequently, as illustrated in FIG. 3A, the high elastic modulus resin portion 3c is formed so as to cover the elastic wave element substrate 4. Then, as illustrated in FIG. 3B, the high elastic modulus resin portion 3c is polished to expose the metal layer 11A.

Figure 4A:
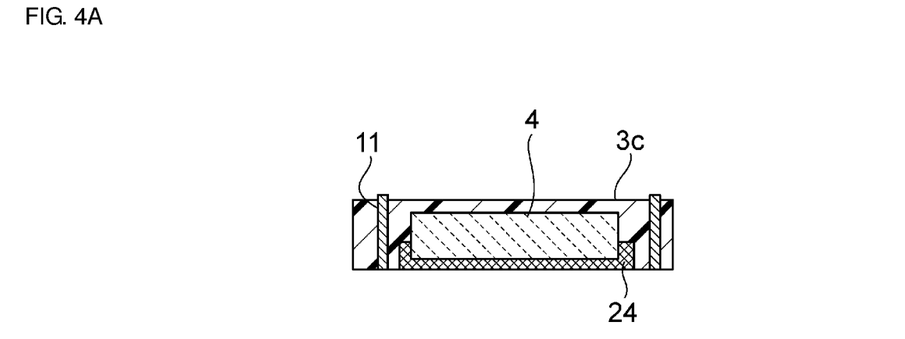
FIGS. 4A to 4C are front cross-sectional views for explaining the manufacturing process of the elastic wave device according to the first preferred embodiment of the present invention.
Figure 4B:
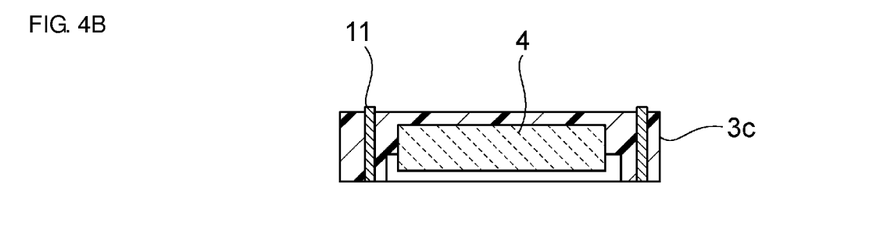
Figure 4C:
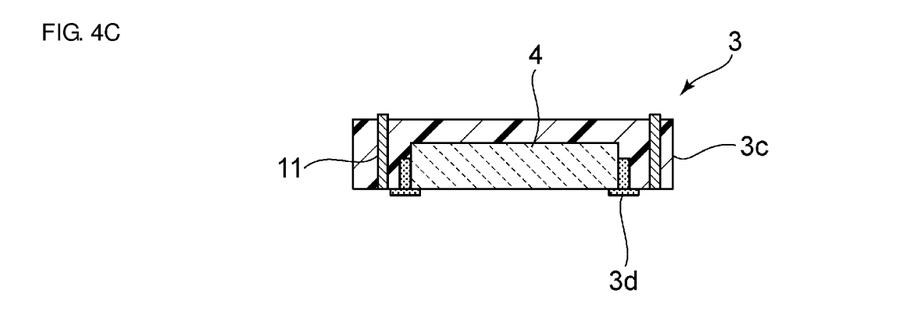

Thereafter, the support substrate 21 is peeled off together with the resist layer 22. As illustrated in FIG. 4A, the high elastic modulus resin portion 3c and the via electrodes 11 located in the high elastic modulus resin portion 3c are thus formed. Thereafter, as illustrated in FIG. 4B, the temporary fixing resin layer 24 is removed using a solvent. Then, as illustrated in FIG. 4C, the low elastic modulus resin portions 3d are formed.

Figure 5:
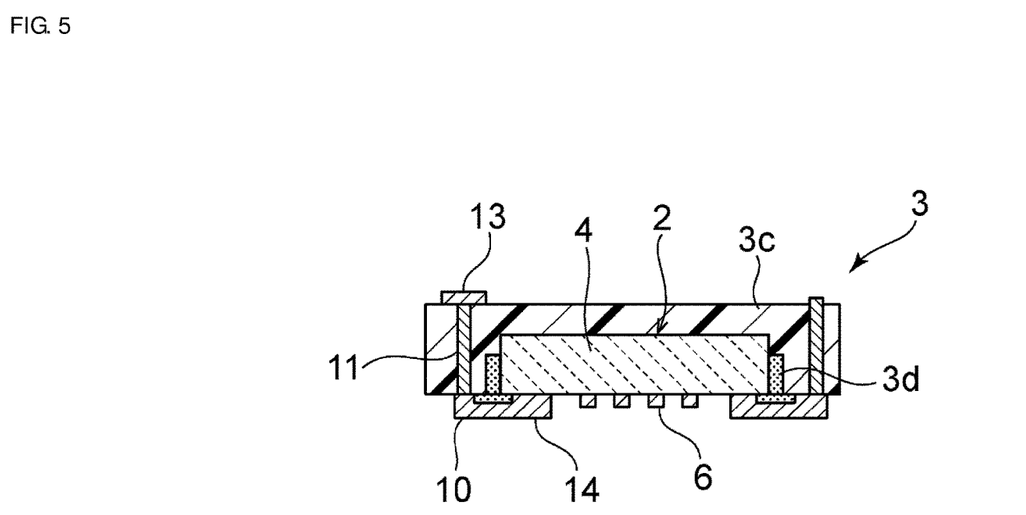
FIG. 5 is a front cross-sectional view for explaining the manufacturing process of the elastic wave device according to the first preferred embodiment of the present invention.

Subsequently, as illustrated in FIG. 5, the IDT electrode 6, the first electrodes 10, the second electrode 13 and the wiring electrodes 14 are provided. In this way, the elastic wave device 1 in the first preferred embodiment can be obtained.

Figure 6:
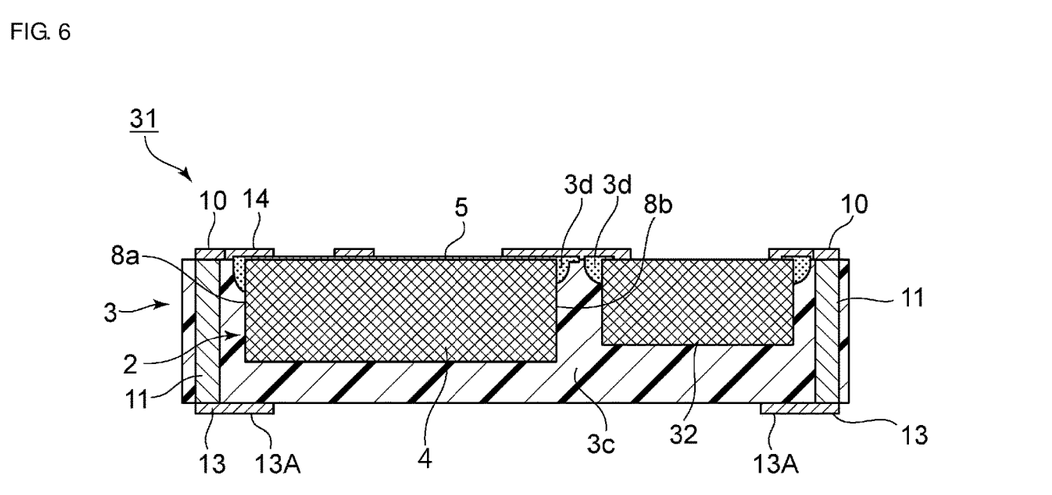
FIG. 6 is a front cross-sectional view of an elastic wave device according to a second preferred embodiment of the present invention.

FIG. 6 is a front cross-sectional view of an elastic wave device according to a second preferred embodiment of the present invention. An elastic wave device 31 includes the elastic wave element 2, an electronic component 32 and the resin structure 3. The elastic wave element 2 has the same configuration as that of the elastic wave element 2 in the first preferred embodiment. Therefore, the same reference numerals denote the same elements and descriptions thereof will be omitted.

The electronic component 32 is an electronic component which is different from the elastic wave element 2. As in the first preferred embodiment, the resin structure 3 includes the low elastic modulus resin portions 3d and the high elastic modulus resin portion 3c.

In the present preferred embodiment, the low elastic modulus resin portions 3d extend not only onto portions of the side surfaces 8a and 8b of the elastic wave element substrate 4 but also onto the IDT electrode formation surface 5. In this preferred embodiment as well, the resin structure 3 includes the low elastic modulus resin portions 3d and the high elastic modulus resin portion 3c, so that changes in characteristics hardly occur when external force is applied and disconnection of the wiring electrodes 14 or the like also hardly occurs as in the first preferred embodiment. Further, it is possible to reliably protect the elastic wave element 2 from the outside with the presence of the high elastic modulus resin portion 3c. In addition, since the other electronic component 32 is also provided in the resin structure 3, it is possible to reduce the size of such a composite component including the elastic wave element 2 and the electronic component 32. Also in the electronic component 32, the low elastic modulus resin portions 3d are provided so as to contact with portions of side surfaces thereof. Therefore, also in the electronic component 32, disconnection of wiring electrodes or the like hardly occurs.

As the electronic component 32, an active device such as a semiconductor device or a passive device such as a capacitor is able to be used. In the case of using any of these electronic components, unlike the elastic wave element 2, changes in characteristics due to external force hardly occur and the presence of the low elastic modulus resin portions 3d effectively reduces or prevents occurrence of the disconnection or the like.

Figure 7A:
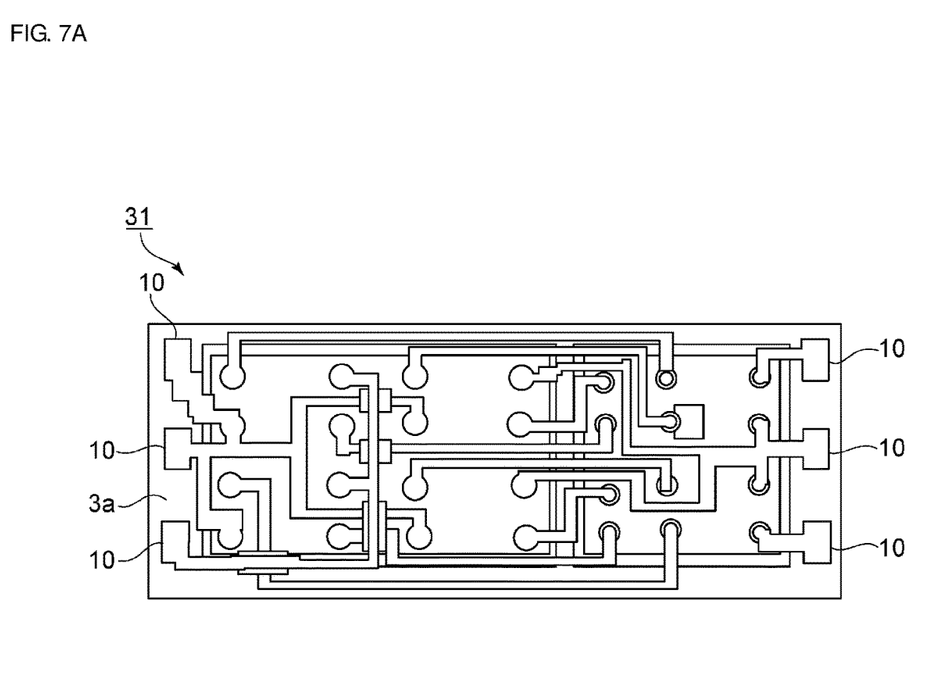
FIGS. 7A and 7B are plan views schematically illustrating structures of electrodes for first and second main surfaces of a resin structure, respectively.
Figure 7B:
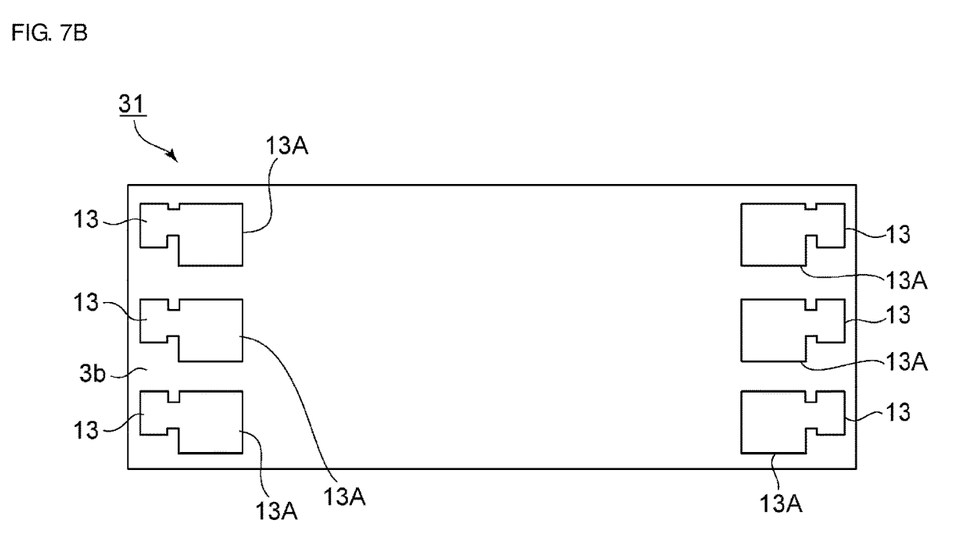

FIGS. 7A and 7B are plan views schematically illustrating the electrode structures of the first main surface 3a and the second main surface 3b of the resin structure 3, respectively. As illustrated in FIG. 7A, the plurality of first electrodes 10, 10 and 10 is provided at each of the sides of one short side and the other short side of the first main surface 3a. The first electrodes 10, 10 and 10 at the side of the one short side are electrically connected to the elastic wave element 2. The first electrodes 10, 10 and 10 at the side of the other short side are electrically connected to the electronic component 32.

The first electrodes 10 are electrically connected to the second electrodes 13 with the via electrodes 11 interposed therebetween. As illustrated in FIG. 7B, terminal electrodes 13A having areas larger than those of the second electrodes 13 are connected to the second electrodes 13. The terminal electrodes 13A are provided at positions overlapping with the elastic wave element 2 and the electronic component 32 in the vertical direction. Therefore, it is possible to easily electrically connect the elastic wave device 31 to the outside by using the terminal electrodes 13A having relatively large areas. As illustrated in FIGS. 7A and 7B, a density of the electrodes on the second main surface 3b preferably is lower than a density of the electrodes on the first main surface 3a. Therefore, it is possible to easily form the large terminal electrodes 13A as described above.

Figure 8:
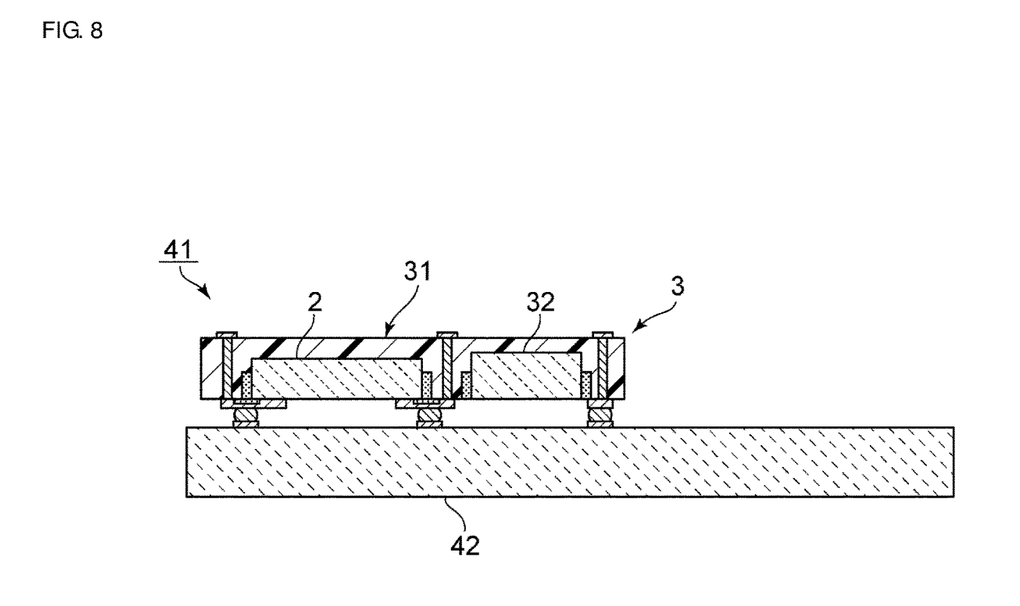
FIG. 8 is a front cross-sectional view of an electronic component according to a third preferred embodiment of the present invention.

FIG. 8 is a front cross-sectional view of an electronic component according to a third preferred embodiment of the present invention. In an electronic component 41 in the third preferred embodiment, the elastic wave device 31 in the second preferred embodiment is mounted on a mounting surface of a mounting substrate 42. As described above, in an electronic component according to a preferred embodiment of the present invention, the elastic wave device 31 may be mounted on the mounting surface of the mounting substrate 42.

Figure 9:
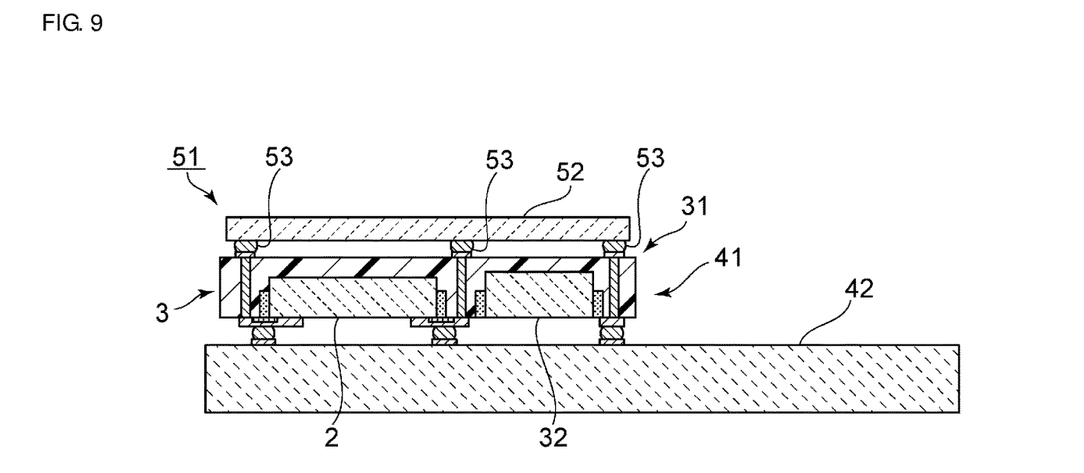
FIG. 9 is a front cross-sectional view of an electronic component according to a fourth preferred embodiment of the present invention.

FIG. 9 is a front cross-sectional view of an electronic component according to a fourth preferred embodiment of the present invention.

In an electronic component 51 in the present preferred embodiment, an electronic component 52 is further laminated on the electronic component 41 in the third preferred embodiment. The electronic component 52 may be an elastic wave device, an active device such as a semiconductor device, or a passive component such as a capacitor or an inductor. The electronic component 52 is laminated on the elastic wave device 31 using a plurality of bumps 53.

In the electronic component 51 illustrated in FIG. 9, the mounting substrate 42 may be omitted. In other words, preferred embodiments of the present invention may include a configuration in which the electronic component 52 is laminated on the elastic wave device 31 described above.

Figure 10:
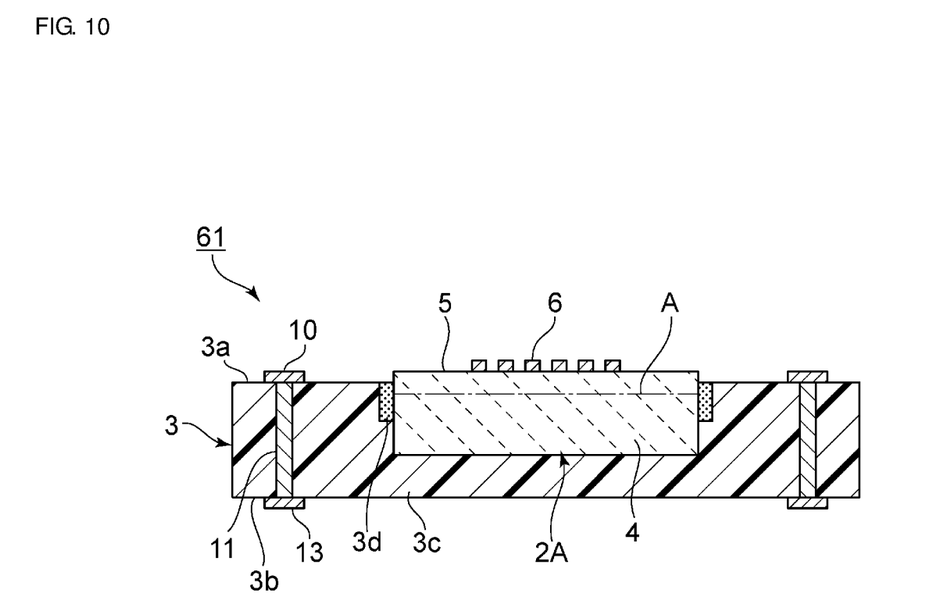
FIG. 10 is a front cross-sectional view of an elastic wave device according to a fifth preferred embodiment of the present invention.

FIG. 10 is a front cross-sectional view of an elastic wave device according to a fifth preferred embodiment of the present invention. In an elastic wave device 61, the thickness of the elastic wave element substrate 4 of an elastic wave element 2A is increased. In other words, the IDT electrode formation surface 5 protrudes to an outer side portion relative to the first main surface 3a of the resin structure 3 in the thickness direction. In this way, the IDT electrode formation surface 5 and the first main surface 3a may not be flush with each other and may be provided at different levels.

However, it is preferable that the IDT electrode formation surface 5 and the first main surface 3a be flush with each other. In this case, even when a wiring across the IDT electrode formation surface 5 and the first main surface 3a of the resin structure 3 is provided, no bending portion is present in the wiring and no stress concentration therefore occurs, so that disconnection of the wiring is significantly reduced or prevented.

The IDT electrode formation surface 5 may be located at a position indicated by a dot-dash line A in FIG. 10. In this case, the IDT electrode formation surface 5 is located in an inner side portion relative to the first main surface 3a in the thickness direction of the resin structure 3. Even in such a case, the presence of the low elastic modulus resin portions 3d and the high elastic modulus resin portion 3c provides the same effects as those obtained in the elastic wave device 1 in the first preferred embodiment. In other words, changes in the characteristics hardly occur when external force is applied. Further, it is possible to reliably protect the elastic wave element 2A from the outside.

In the above-described preferred embodiments, the elastic wave element 2 and 2A include the elastic wave element substrate 4. However, as in an elastic wave element substrate 4A in a variation illustrated in FIG. 11, the configuration in which a low sound speed layer 72 and a high sound speed layer 73 are laminated on a piezoelectric thin film 71 may be used. The low sound speed layer 72 is made of a material having a lower sound speed of a bulk wave propagating therein than that of an elastic wave propagating in the piezoelectric thin film 71. The high sound speed layer 73 is made of a material having a higher sound speed of a bulk wave propagating therein than that of the elastic wave propagating in the piezoelectric thin film 71.

Further, a larger number of low sound speed layers and high sound speed layers may be alternately laminated.

In addition, a laminated body in which a low acoustic impedance layer and a high acoustic impedance layer are alternately laminated may be laminated on the piezoelectric thin film 71.

Figure 11:
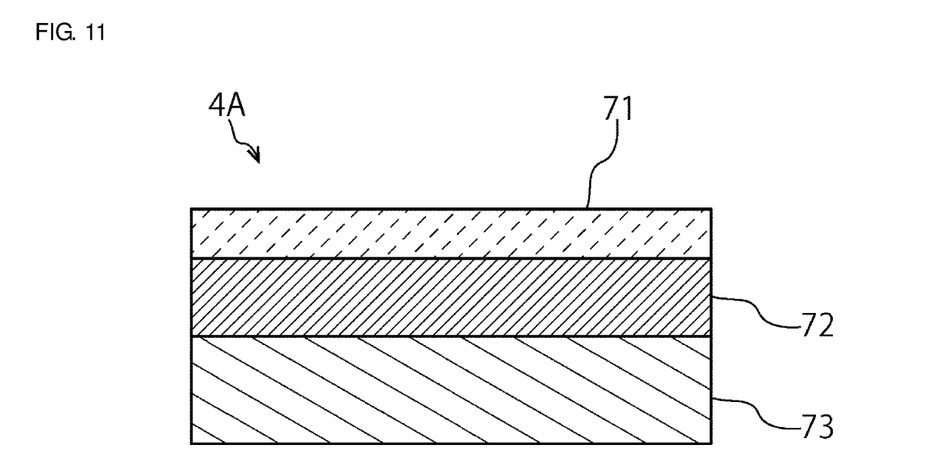
FIG. 11 is a front cross-sectional view for explaining a variation of an elastic wave element substrate in an elastic wave device according to a preferred embodiment of the present invention.

As described above, also in the elastic wave element substrate 4A using the piezoelectric thin film 71, as in the case of the above-described elastic wave element substrate 4 defined by the piezoelectric body, there is a risk that electrical characteristics are changed due to a piezoelectric effect when external force is applied. Accordingly, by using the resin structure having the low elastic modulus resin portions and the high elastic modulus resin portion in various preferred embodiments of the present invention, it is possible to obtain the same effects as those obtained in the first to fifth preferred embodiments.

Figure 12:
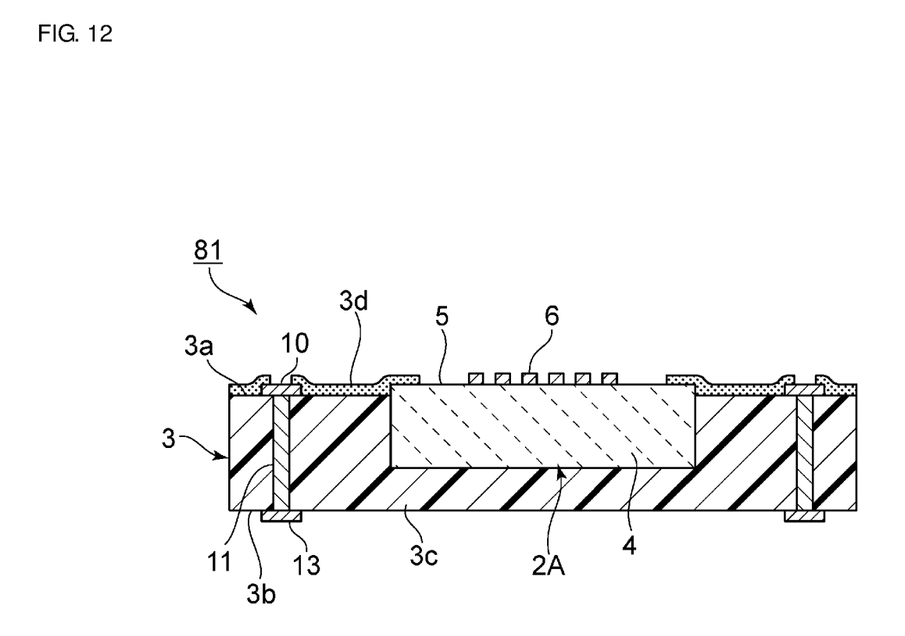
FIG. 12 is a front cross-sectional view of an elastic wave device according to a sixth preferred embodiment of the present invention.

FIG. 12 is a front cross-sectional view of an elastic wave device according to a sixth preferred embodiment of the present invention. In an elastic wave device 81, the low elastic modulus resin portions 3d are provided so as to contact with upper end portions of side surfaces of the elastic wave element substrate 4. The low elastic modulus resin portions 3d are exposed on the upper surface of the resin structure 3 and are provided so as to extend from the upper surface of the high elastic modulus resin portion 3c to the upper surface of the elastic wave element substrate 4. Also in this case, the low elastic modulus resin portions 3d are provided in the regions of the side surfaces of the elastic wave element substrate 4, which extend from the end portions at the IDT electrode formation surface 5 side and do not reach the opposite surface. The high elastic modulus resin portion 3c contacts with a remaining portion of the side surfaces of the elastic wave element substrate 4. Accordingly, in the sixth preferred embodiment, it is possible to obtain the same effects as those in the first to fifth preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   an elastic wave element including an elastic wave element substrate including an IDT electrode formation surface and an IDT electrode provided on the IDT electrode formation surface; and
   a resin structure including first and second main surfaces opposing each other and being embedded with the elastic wave element such that at least a portion of the IDT electrode formation surface is exposed at the first main surface side; wherein
   the resin structure includes a high elastic modulus resin portion having a relatively high elastic modulus and a low elastic modulus resin portion having a relatively low elastic modulus;
   the low elastic modulus resin portion is provided in a region of a side surface of the elastic wave element substrate, which extends from an end portion at the IDT electrode formation surface side and does not reach a surface at a side opposite to the IDT electrode formation surface; and
   a remaining resin portion of a portion of the resin structure, which contacts with the side surface of the elastic wave element substrate, is the high elastic modulus resin portion.

2. The elastic wave device according to claim 1, wherein the IDT electrode formation surface of the elastic wave element substrate and the first main surface of the resin structure are flush with each other.

3. The elastic wave device according to claim 1, wherein the IDT electrode formation surface of the elastic wave element substrate is not flush with the first main surface of the resin structure.

4. The elastic wave device according to claim 1, wherein the resin structure includes:
   a through-electrode penetrating from the first main surface to the second main surface; and
   a first electrode provided on the first main surface and connected to the through-electrode; wherein
   the first electrode is electrically connected to the elastic wave element.

5. The elastic wave device according to claim 1, wherein the resin structure includes a plurality of second electrodes provided on the second main surface and connected to the through-electrode;

the plurality of first electrodes is provided on the first main surface; and a density of the plurality of second electrodes is lower than a density of the plurality of first electrodes.

6. The elastic wave device according to claim 1, wherein the low elastic modulus resin portion extends onto the IDT electrode formation surface of the elastic wave element substrate.

7. The elastic wave device according to claim 4, further including a wiring electrode connected to the first electrode and extending from a top of the first main surface of the resin structure to the IDT electrode formation surface of the elastic wave element.

8. The elastic wave device according to claim 7, wherein the wiring electrode extends onto the lower elastic modulus resin portion which extends onto the IDT electrode formation surface.

9. The elastic wave device according to claim 1, wherein the elastic wave element substrate is a piezoelectric substrate.

10. The elastic wave device according to claim 1, wherein the elastic wave element substrate includes a piezoelectric thin film and a high sound speed member provided on one surface of the piezoelectric thin film and having a higher sound speed of a bulk wave which is propagating than a sound speed of an elastic wave propagating in the piezoelectric thin film.

11. The elastic wave device according to claim 10, further including a low sound speed member provided between the high sound speed member and the piezoelectric thin film and having a lower sound speed of a bulk wave which is propagating than the sound speed of the elastic wave propagating in the piezoelectric thin film.

12. The elastic wave device according to claim 1, further including an electronic component laminated on the second main surface of the resin structure.

13. An electronic component comprising:

a mounting substrate including a mounting surface; and the elastic wave device according to claim 1 mounted on the mounting surface of the mounting substrate.

14. The electronic component according to claim 13, wherein the IDT electrode formation surface of the elastic wave element substrate and the first main surface of the resin structure are flush with each other.

15. The electronic component according to claim 13, wherein the IDT electrode formation surface of the elastic wave element substrate is not flush with the first main surface of the resin structure.

16. The electronic component according to claim 13, wherein the resin structure includes:

a through-electrode penetrating from the first main surface to the second main surface; and a first electrode provided on the first main surface and connected to the through-electrode; wherein the first electrode is electrically connected to the elastic wave element.

17. The electronic component according to claim 13, wherein the resin structure includes a plurality of second electrodes provided on the second main surface and connected to the through-electrode;

the plurality of first electrodes is provided on the first main surface; and a density of the plurality of second electrodes is lower than a density of the plurality of first electrodes.

18. The electronic component according to claim 13, wherein the low elastic modulus resin portion extends onto the IDT electrode formation surface of the elastic wave element substrate.

19. The electronic component according to claim 16, further including a wiring electrode connected to the first electrode and extending from a top of the first main surface of the resin structure to the IDT electrode formation surface of the elastic wave element.

20. The electronic component according to claim 19, wherein the wiring electrode extends onto the lower elastic modulus resin portion which extends onto the IDT electrode formation surface.

* * * * *